US008975008B2

(12) United States Patent
Ciccolo et al.

(10) Patent No.: US 8,975,008 B2
(45) Date of Patent: Mar. 10, 2015

(54) METHOD OF REMOVING NEGATIVE ACTING PHOTORESISTS

(71) Applicant: Rohm and Haas Electronic Materials LLC, Marlborough, MA (US)

(72) Inventors: Paul J. Ciccolo, Ashland, MA (US); Brian D. Amos, Worcester, MA (US); Stephen McCammon, Wayland, MA (US)

(73) Assignee: Rohm and Haas Electronic Materials LLC, Maryland, MA (US)

( * ) Notice: Subject to any disclaimer, the term of this patent is extended or adjusted under 35 U.S.C. 154(b) by 0 days.

(21) Appl. No.: 13/898,802

(22) Filed: May 21, 2013

(65) Prior Publication Data

US 2014/0154631 A1    Jun. 5, 2014

Related U.S. Application Data

(60) Provisional application No. 61/651,340, filed on May 24, 2012.

(51) Int. Cl.
*G03F 7/42* (2006.01)

(52) U.S. Cl.
CPC ..................................... *G03F 7/425* (2013.01)
USPC .......................................................... 430/329

(58) Field of Classification Search
CPC ............ G03F 7/422; G03F 7/425; G03F 7/26
USPC .................................................... 430/325, 329
See application file for complete search history.

(56) References Cited

U.S. PATENT DOCUMENTS

| 4,592,787 | A |   | 6/1986 | Johnson |       |
|-----------|---|---|--------|---------|-------|
| 5,139,607 | A | * | 8/1992 | Ward et al. | 216/83 |
| 5,286,599 | A |   | 2/1994 | Babich et al. |     |
| 5,296,332 | A |   | 3/1994 | Sachdev et al. |    |
| 6,436,276 | B1 | * | 8/2002 | Yakobson | 205/703 |
| 6,440,647 | B1 | * | 8/2002 | Yakobson | 430/329 |
| 6,913,867 | B2 |   | 7/2005 | Imai |        |
| 2003/0060382 | A1 |   | 3/2003 | Lee et al. |    |
| 2003/0130147 | A1 | * | 7/2003 | Koito et al. | 510/175 |

FOREIGN PATENT DOCUMENTS

| JP | 2001005201 A | 1/2001 |
| WO | 0229496 A1 | 4/2002 |
| WO | 2012161790 A1 | 11/2012 |

OTHER PUBLICATIONS

European Search Report of corresponding European Application No. 13 16 8681.8.

* cited by examiner

*Primary Examiner* — Brittany Raymond
(74) *Attorney, Agent, or Firm* — John J. Piskorski

(57) ABSTRACT

Polymerized negative acting photoresists are removed from substrates at relatively low temperatures and fast stripping times using aqueous based alkaline solutions.

8 Claims, 4 Drawing Sheets

METHOD OF REMOVING NEGATIVE ACTING PHOTORESISTS

This application claims the benefit of priority under 35 U.S.C. §119(e) to U.S. Provisional Application No. 61/651,340, filed May 24, 2012, the entire contents of which application are incorporated herein by reference.

FIELD OF THE INVENTION

The present invention is directed to a method of removing polymerized negative acting photoresists from substrates. More specifically, the present invention is directed to removing polymerized negative acting photoresists from substrates at low temperatures and increased stripping efficiency using improved aqueous based alkaline solutions.

BACKGROUND OF THE INVENTION

Negative acting photoresists exposed to activating radiation polymerize or cross-link in a reaction between photoactive compounds and polymerizable agents of the photoresist composition. Consequently, the exposed coating portions are rendered less soluble in developer solutions than unexposed portions. For positive working photoresists, exposed portions are rendered more soluble in developer solutions while areas not exposed remain comparatively less developer soluble.

Negative acting photoresists, such as dry film photoresists, may be primary photoimaging resists or secondary photoimaging resists. Primary photoresists are used to form temporary coatings on substrates. Secondary photoresists are hardenable and form permanent layers, e.g., solder masks. Negative acting photoresists have various requisites such as etch resistance, heat resistance and adhesion.

Dry film photoresists include at least a resin binder, a cross-linking monomer or oligomer and a photoinitiator. A wide variety of polymeric binders may be employed in dry film photoresists. Such polymeric binders may include, as polymerized components, one or more acid functional monomers such as acrylic acid or methacrylic acid. Polymeric binders take up space in the photoresist and are passively linked to the cross-linking monomers or oligomers. Photoinitiators initiate the cross-linking reaction between the cross-linking monomers or oligomers upon exposure to light. Other additives included in photoresists are anti-striation reagents, plasticizers, speed enhancers, surfactants, fillers, and dyes.

Negative acting dry film photoresists may be laminated to a substrate. Such dry film photoresists are particularly suitable for use in printed circuit board manufacture. One problem with many primary dry film photoresists is that they are difficult to strip from metal plated circuit boards using conventional alkaline aqueous stripping solutions, e.g. 3% sodium hydroxide solutions. If the photoresist is not completely stripped and removed, ragged metal circuit lines may result which may cause short-circuiting of the board.

Many manufacturers use organic-based or organic solvent-containing alkaline stripping solutions to facilitate stripping and to produce smaller stripped particles than aqueous based strippers. Organic-based strippers also have been used for many years because they remove polymerized photoresists at faster rates than aqueous based strippers. The faster the removal rate the more efficient the manufacturing process. Stripping temperatures typically range from 55° C. to 60° C. for organic-based strippers.

While the organic-based and organic solvent-containing alkaline strippers are preferred over aqueous based strippers because of their over-all better stripping performance, such strippers are expensive relative to alkaline aqueous strippers. Organic-based strippers and organic solvent-containing strippers include more aggressive additives than aqueous alkaline strippers, such as ethylenediamine and ethylene glycol monobutyl ether. Such additives are inherently toxic to workers and the environment and are difficult to waste treat. Organic-based and organic solvent-containing strippers typically include high concentrations of volatile organic compounds (VOCs). VOCs are organic chemicals that have high vapor pressures at ordinary room temperature conditions. Their high vapor pressure results from low boiling points which causes large numbers of molecules to evaporate or sublime from a liquid or solid form of the compound and enter the surrounding air. Many VOCs are dangerous to human health and cause harm to the environment. Accordingly, there is a need for an improved method of removing polymerized negative acting photoresists from substrates using aqueous based alkaline solutions.

SUMMARY OF THE INVENTION

Methods include providing a substrate including polymerized negative acting photoresist; and contacting the substrate including the polymerized negative acting photoresist with an aqueous alkaline solution including ammonium hydroxide to remove the polymerized negative acting photoresist from the substrate.

The methods enable rapid removal of substantially all polymerized negative acting photoresist from the substrate at temperatures lower than many conventional removing or stripping methods. The lower temperatures reduce evaporation loss, thus extending the bath life of the aqueous alkaline stripping solution. The stripped polymerized negative acting photoresist forms water-insoluble, non-adhesive particles which settle to the bottom of the bath and are readily removed by conventional apparatus. The methods also enable workers to control particle size of the stripped photoresist. Thus, the probability of substrate contamination and defects in the final article are reduced. These features reduce cost in the manufacture of articles where such negative acting photoresists are readily used. In addition, the methods have reduced VOC, thus being more environmentally friendly than many conventional stripping methods used for removing polymerized negative acting photoresists.

DETAILED DESCRIPTION OF THE INVENTION

Figure 1:
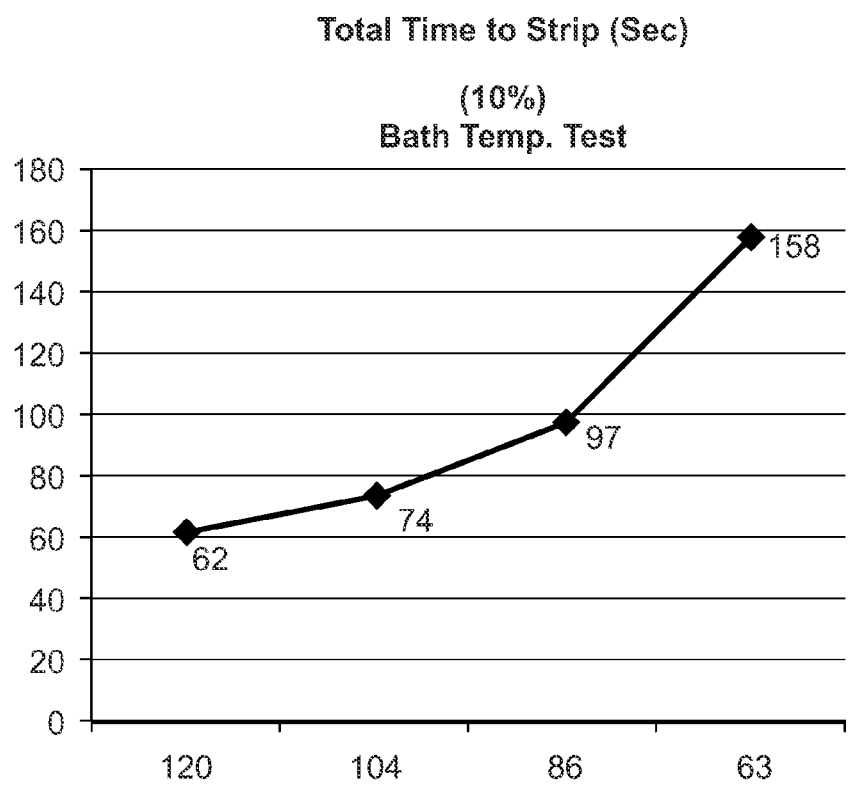
FIG. 1 is a graph of stripping time vs. temperature in degrees Fahrenheit for polymerized dry film photoresist being stripped with a 10% by alkaline solution.

As used throughout this specification, the terms "depositing" and "plating" are used interchangeably. The terms "removing" and "stripping" are used interchangeably. The terms "solution" and "bath" are used interchangeably. The indefinite articles "a" and "an" are intended to include both the singular and the plural. The term "selectively depositing" means that material deposition occurs in specific desired areas on a substrate. The term "alkaline solution" means a solution which has a pH of greater than 7.0.

The following abbreviations have the following meanings unless the context clearly indicates otherwise: ° C.=degrees Celsius; ° F.=degrees Fahrenheit; ° C.=5/9(° F.=32); UV=ultra violet; g=grams; ml=milliliter; L=liter; bv=by volume; µm=microns; min.=minute; sec.=second; and VOC=volatile organic carbon. All percentages and ratios are by weight unless otherwise indicated. All ranges are inclusive and combinable in any order except where it is clear that such numerical ranges are constrained to add up to 100%.

Polymerized negative acting photoresists are removed from substrates with aqueous-based alkaline solutions of ammonium hydroxide. The aqueous-based alkaline stripping solution containing ammonium hydroxide may be applied to the polymerized negative acting photoresist by immersing the substrate which includes the polymerized photoresist into the stripping solution or spraying the solution onto the polymerized photoresist. The aqueous alkaline stripping solution is maintained at temperatures of 15° C. to 50° C., preferably from 35° C. to 50° C., during stripping. The low stripping temperatures, in contrast to higher conventional stripping temperatures, reduce evaporation loss, thus extending the bath life of the solution. The aqueous alkaline solution breaks down the polymerized photoresist such that the stripped photoresist forms substantially water-insoluble, non-adhesive particles which may be rinsed from the substrate and settle at the bottom of the container where the stripping is done. Complete dissolution or solubilization of the photoresist is undesirable because the acid functional groups of the photoresist would neutralize the aqueous alkaline stripping solution requiring more aggressive replenishment of the aqueous stripper and increased cost of stripping the photoresist. The stripped substrate may then be further processed without concern that the water-insoluble, non-adhesive particles may cause contamination. The particles at the bottom of the bath may be readily removed using conventional filtering apparatus. Stripping times may vary; however, typically, stripping is completed over a period of 20 sec. to 5 min., more typically from 30 sec. to 3 min.

The aqueous alkaline solution may be made-up as a concentrate and diluted prior to use as needed Ammonium hydroxide is included in the alkaline stripping solution at stripping concentration ranges of 0.1 g/L to 15 g/L, preferably from 1 g/L to 10 g/L.

In addition to ammonium hydroxide, the aqueous alkaline solution can optionally include one or more alkali metal hydroxides, one or more organic alkaline compounds and one or more corrosion inhibitors. Such compounds may be included in the aqueous alkaline stripper solution provided that they are sufficiently water-soluble. These compounds may be included in the aqueous alkaline solution as needed to assist in the breakdown of polymerized negative acting photoresist.

Alkali metal hydroxides include sodium hydroxide and potassium hydroxide. Preferably sodium hydroxide is used. Alkali metal hydroxides may be included in the alkaline stripping solution in amounts of 0.5 g/L to 1 g/L.

Organic alkaline compounds include alkanolamines and quaternary ammonium hydroxides. In general, the organic alkaline compounds are included in the alkaline stripping solution at stripping concentration ranges of 0.5 g/L to 100 g/L, preferably from 1 g/L to 85 g/L. Alkanolamines include, but are not limited to, monoethanolamine, diethanolamine, triethanolamine, 2-(2-aminoethoxy)ethanol, monoisopropanolamine, diisopropanolamine, triisopropanolamine, N-ethylethanolamine and N-butylethanolamine. Preferably, monoethanolamine, diethanolamine and triethanolamine are included in the alkaline solution. Quaternary ammonium hydroxides include, but are not limited to, tetramethylammonium hydroxide, tetraethylammonium hydroxide, tetrapropylammonium hydroxide and trimethyl(2-hydroxyethyl)ammonium hydroxide. Preferably tetramethylammonium hydroxide and tetraethylammonium hydroxide are used.

Anticorrosion inhibitors include, but are not limited to, aromatic hydroxyl compounds and triazole compounds. Aromatic hydroxyl compounds include, but are not limited to, phenol, cresol, xylenol, pyrocatechol, resorcinol, hydroquinone, p-hydroxybenzyl alcohol, o-hydroxybenzyl alcohol, 2,4-dihydroxybenzoic acid, 2,5-dihydroxybenzoic acid, 3,4-dihydroxybenzoic acid and 3,5-dihydroxybenzoic acid. Triazole compounds include, but are not limited to, benzotriazole, 5,6-dimethylbenzotriazole, 1-hydroxybenzotriazole, 1-methylbenzotriazole, 1-pheylbenzotriazole, o-tolyltriazole, m-tolyltriazole, p-tolyltriazole, carboxybenzotriazole, 1-hydroxybenzotriazole, nitrobenzotriazole and dihydroxypropylbenzotriazole. Preferably, benzotriazole, o-tolyltriazole, m-tolyltriazole and p-tolyltriazole are used. Aromatic hydroxyl compounds and triazole compounds are included in the aqueous alkaline stripping solutions at stripping concentration ranges of 0.1 g/L to 5 g/L, preferably 0.1 g/L to 3 g/L.

Negative acting photoresists may vary in their specific composition from one manufacturer to another. Negative acting photoresists polymerize in an image-wise fashion when irradiated with light. Negative acting photoresists are well reported in the literature and are commercially available. Examples of commercially available negative acting photoresists are Novolac resins, such as epoxy and phenolic resins and the LAMINAR™ dry film photoresist series, such as E 9213, E 9215, E 8020, E 7620 and E9220.

In general, negative acting photoresists include ethylenically or polyethylenically unsaturated polymerizable materials in combination with photosensitive free radical generators, although photosensitive epoxy systems with photoinitiated cationic polymerization catalysts are also known in the art. Typically ethylenically unsaturated photopolymerizable systems are used, such as acrylate, methacrylate, acrylamide, and allyl systems. Acrylic and methacrylic polymerizable systems of oligomers, trimers, dimmers or monomers in combination with free radical photoinitiators are typically used. Non-polymerizable binders, dyes, pigments, antioxidants, fillers, surfactants, antistatic agents, lubricants and other well known additives may be present. Examples of useful binders are acrylic resins, such as alkyl methacrylate, ethylacrylate and copolymers thereof, polymeric polymers, such as polyvinyl alcohol and hydroxyl substituted addition polyesters, such as polyacrylate and polymethylacrylate polyesters, hydroxyl substituted copolymers, natural colloids, polyvinyl hydrogenpthalate, ethylene oxide polymers, and copolymers, polyacrylamides, polyethylincally unsaturated materials, polyamides and polyesters.

Negative acting photoresists are typically used in imaging for the formation of patterns on various types of substrates. Typically negative acting photoresists are used in the formation of patterns in the manufacture of printed circuit boards. In the manufacture of printed circuit boards, the aqueous alkaline solutions are used to strip both inner and outer layer polymerized photoresists. Inner layer polymerized photoresist is at least 10 µm thick. Preferably the inner layer is 30 µm to 40 µm thick. The outer layer is at least 25 µm thick. Preferably the outer layer is 50 µm to 100 µm. The aqueous alkaline solutions readily strip such thick polymerized photoresist from printed circuit boards.

In general, the negative acting photoresist is applied to a copper clad printed circuit board, such as an FR4/glass/epoxy board, and dried. The photoresist may be applied to the copper clad board by conventional methods, such as by hot roller laminator. The photoresist is dried at temperatures of 90° C. to 120° C. The negative acting photoresist is a dry film it is provided with a cover coat before polymerizing by light exposure. Typically the cover sheet is polyester. Alternatively, the photoresist may be coated with hydroxyethyl cellulose or polyvinyl acetate (PVA). Polycarbonate also may be used.

The cover coat is irradiated with activating radiation, such as UV light, either directly or through a mask to obtain a desired pattern. Various conventional lamps may be used as the source of activating radiation. The irradiation selectively polymerizes the negative acting photoresist such that the sections of the photoresist not polymerized may be removed with conventional alkaline developer solutions. The developing solution is sprayed onto the photoresist or the entire board with the photoresist in immersed in the developer solution. Developing may be done at temperatures of 10° C. to 80° C., preferably from 25° C. to 35° C. and may take from 1-60 min. to remove substantially all of the un-polymerized photoresist. The polymerized photoresist is a negative of the pattern formed on the copper clad board after developing. Conventional printed circuit board processes may then follow such as metal plating or etching of the exposed copper where the polymerized photoresist functions as either a plating resist or an etch resist.

The polymerized photoresist is then stripped from the copper using the aqueous alkaline stripping solution. The pH of the solution is greater than 7. Typically the pH is 10 to 14. Preferably the pH of the solution is 11 to 13.

The stripping is done at temperatures of 15° C. to 50° C., preferably from 35° C. to 50° C. The polymerized photoresist breaks down into water-insoluble, non-adhesive particles as opposed to dissolving in the alkaline stripping solution. In general, the particle size is smaller and preferable when stripping is done at the higher temperatures of 35° C. to 50° C. Faster stripping is achieved at higher component concentrations. In addition, the particle size may be controlled by varying the concentration of components in the aqueous stripping solution. In general, stripping solutions at relatively high concentrations strip photoresist with large particles in comparison to more dilute stripping solutions which strip photoresist with smaller particles. Outer layer printed circuit boards are typically plated with fine metal traces, such as copper. The height of the plated lines is difficult to control across the full width of the board. Some areas become over-plated, i.e., the plated line exceeds the height of the photoresist. This over-plated line mushrooms over the top of the photoresist partially encapsulating it. If the photoresist does not break down into small non-adhesive particles, it may become entrapped between two overhanging plated lines. Breaking down the photoresist to relatively small particles also allows more complete removal of the photoresist from the fine traces. Accordingly, more dilute solutions of the stripper are used to remove polymerized photoresist from outer layer printed circuit boards. In contrast, inner layer boards do not include such fine traces or suffer from mushrooming problems. Accordingly, more concentrated solutions may be used to strip polymerized photoresist from inner layer boards. The larger particles are removed from the boards at a faster rate than smaller particles; however, the particles stripped from the boards cannot be too large such that they form large sheets of photoresist which can wrap around conveyor rollers causing transport and maintenance issues. Minor experimentation may be done to tailor the aqueous alkaline stripping solution for a particular outer layer or inner layer board to achieve the desired stripping.

The water-insoluble, non-adhesive particles are rinsed from the printed circuit board and settle at the bottom of the container where the stripping is done. The particles are then removed from the container to prevent contamination of the printed circuit board. The board is then further processed by conventional processes. The method may be used to manufacture single or multilayer printed circuit boards where thick polymerized negative acting photoresist is to be removed.

The methods enable rapid removal of substantially all polymerized negative acting photoresist from the substrate at temperatures lower than many conventional stripping methods. The lower temperatures reduce evaporation loss, thus extending the bath life of the aqueous alkaline stripping solution. The stripped polymerized negative acting photoresist forms water-insoluble, non-adhesive particles which settle to the bottom of the bath and are readily removed by conventional apparatus. The methods also enable workers to control particle size of the stripped photoresist. Thus, the probability of substrate contamination and defects in the final article are reduced. These features reduce cost in the manufacture of articles where such negative acting photoresists are readily used. In addition, the methods have reduced VOC, thus being more environmentally friendly than many conventional stripping methods used for removing polymerized negative acting photoresists.

The following examples are intended to further illustrate the present invention but are not intended to limit the scope of the invention.

Example 1

The following alkaline stripping concentrate solution was prepared.

TABLE 1

| COMPONENT | AMOUNT |
| --- | --- |
| Ammonium hydroxide | 4.6 g/L |
| Tolyltriazole | 1 g/L |
| Monoethanolamine | 42 g/L |
| Tetramethylammonium hydroxide | 13.4 g/L |
| Water | Balance |

1200 ml of a 10% by aqueous alkaline stripping solution was made up from the stock concentrate. The 10% by solution was then split into four separate solutions of equal volume in beakers.

Four copper ingots coated on one side with polymerized LAMINAR™ E9220 negative acting dry film photoresist 50 µm thick were inserted half-way into one of the four stripper solutions. Each solution was then heated to a temperature of 49° C. (120° F.), 40° C. (104° F.), 30° C. (86° F.) or 17° C. (63° F.). The pH of each solution was 12. The time it took for all of the photoresist exposed to the alkaline solution to strip from each copper ingot was recorded. A graph was made of total time to strip vs. temperature as shown in FIG. 1. The results showed that all of the polymerized photoresist was stripped from the copper ingots within a temperature range of 17° C. to 49° C.

Figure 2:
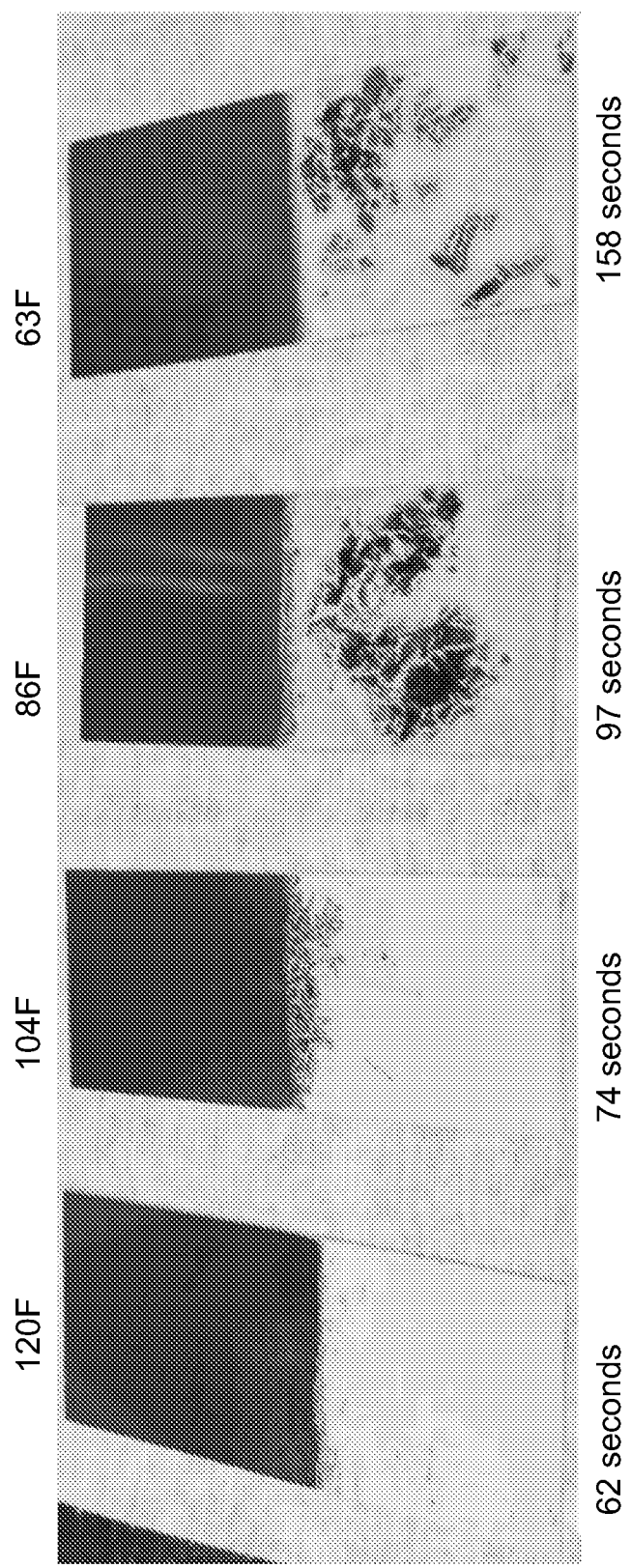
FIG. 2 is a photograph of four copper ingots having been partially stripped of polymerized dry film photoresist with a 10% by alkaline solution at four different stripping temperatures.
Figure 3:
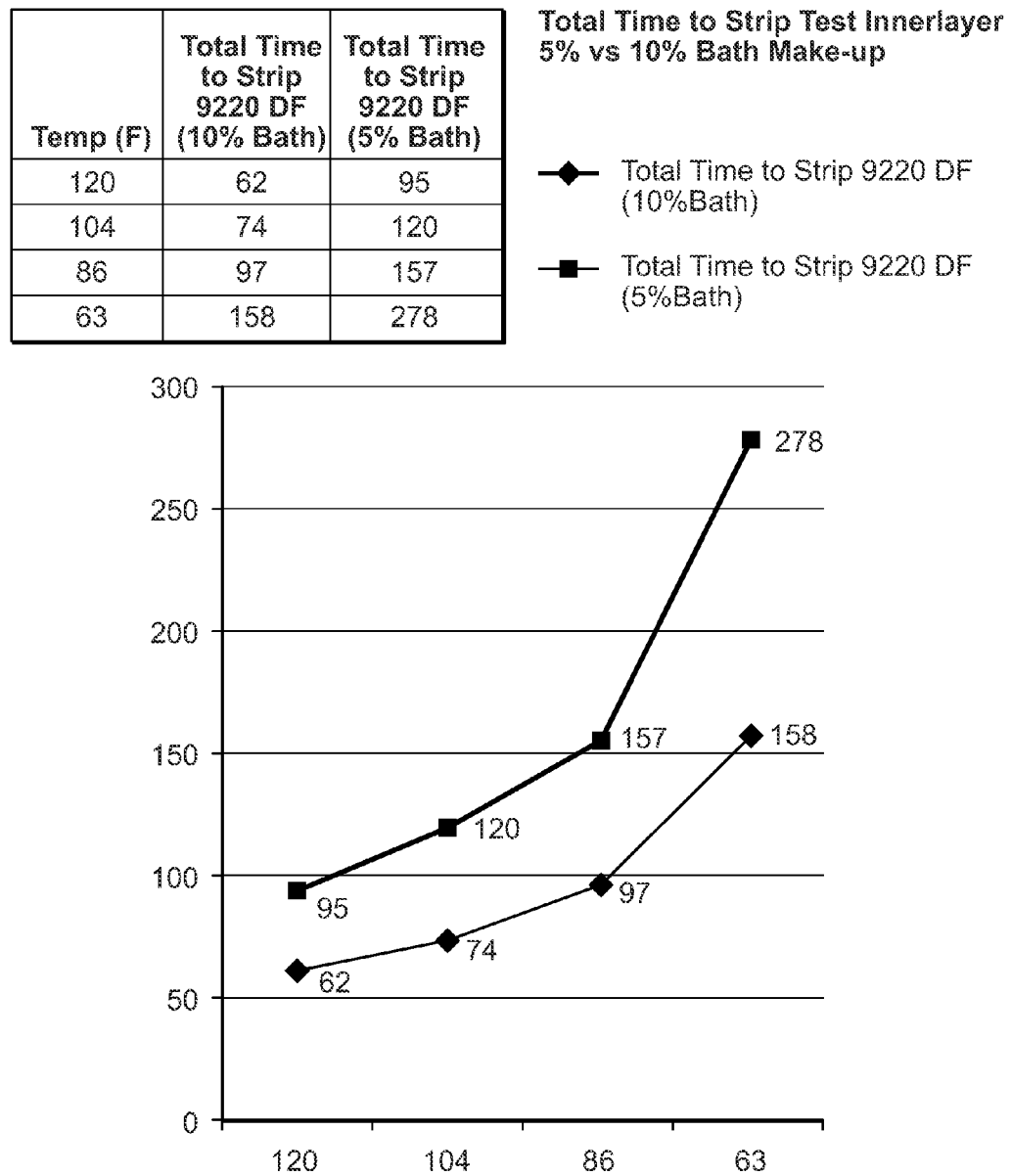
FIG. 3 is a graph of stripping time vs. temperature in degrees Fahrenheit for polymerized dry film being stripped with 5% by and 10% by alkaline solutions.

FIG. 2 is a photograph of the four copper ingots after the polymerized photoresist was stripped. The ingots treated at 49° C. and 40° C. were rinsed with water to remove any particles formed by the interaction between the photoresist and the alkaline stripper to show the bare copper and complete removal of the photoresist. The bottom of the two ingots is the bare copper with the darker upper portion the polymerized photoresist which was not immersed in the alkaline stripping solution. The ingots heated to temperatures of 30° C. and 17° C. were not rinsed with water in order to show how the photoresist breaks up into particles as opposed to actually dissolving in the alkaline stripping solution.

Example 2

The method described in Example 1 above was repeated except that in addition to a 10% by dilution of the alkaline concentrate a 5% by dilution was also tested with four copper ingots coated with 50 μm of polymerized LAMINAR™ E9220 negative acting dry film photoresist. Table 2 discloses the solution for the 5% by dilution.

TABLE 2

| COMPONENT | AMOUNT |
| --- | --- |
| Ammonium hydroxide | 2 g/L |
| Tolyltriazole | 0.5 g/L |
| Monoethanolamine | 21 g/L |
| Tetramethylammonium hydroxide | 7 g/L |
| Water | Balance |

Each solution was then heated to a temperature of 49° C. (120° F.), 40° C. (104° F.), 30° C. (86° F.) or 17° C. (63° F.). The pH of each solution was 12. A graph was made of total time to strip vs. temperature as shown in FIG. 2. The results showed that all of the polymerized photoresist was stripped from the copper ingots within a temperature range of 17° C. to 49° C. for both the 10% by solution and 5% by solution, although the time periods for complete removal varied. In general, it was observed that the particles of photoresist stripped using either solution were smaller when stripped at the higher temperatures of 40° C. and 49° C. than at the lower temperatures of 17° C. to 30° C. This was indicative of the ability to control particle size by controlling temperature.

Figure 4:
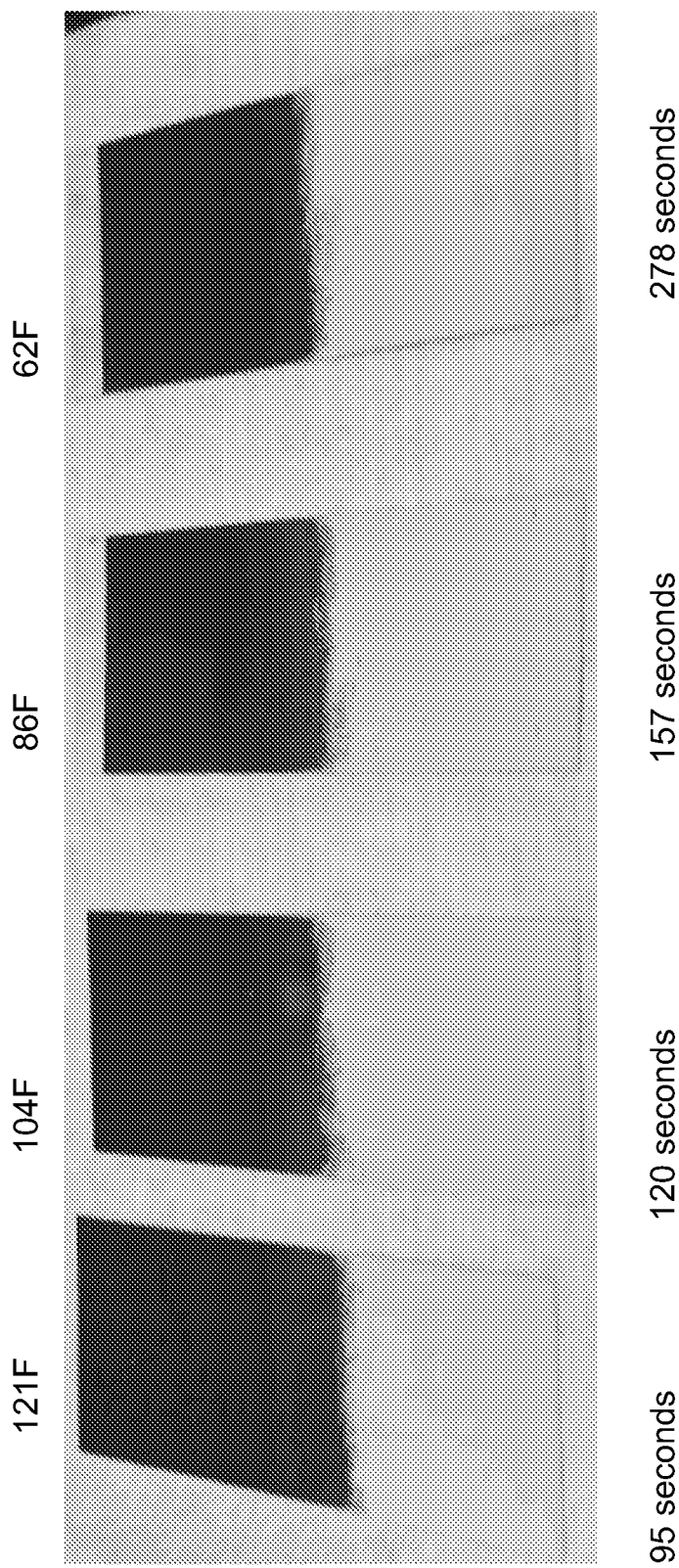
FIG. 4 is a photograph of four copper ingots having been stripped of polymerized dry film photoresist with a 5% by alkaline solution at four different stripping temperatures.

FIG. 4 is a photograph of the four copper ingots after the polymerized photoresist was stripped using the 5% by dilution. The ingots were rinsed with water to remove any particles formed by the interaction of the photoresist and the alkaline stripper to show the complete removal of the photoresist from the copper. The bottom of the ingots is the bare copper with the darker upper portion the polymerized photoresist which was not immersed in the alkaline stripping solution.

Example 3

The method of Example 2 was repeated except that the dilution of the formulation in was a 15% by dilution with component concentrations as shown in Table 3 below.

TABLE 3

| COMPONENT | AMOUNT |
| --- | --- |
| Ammonium hydroxide | 7 g/L |
| Tolyltriazole | 2 g/L |
| Monoethanolamine | 63 g/L |
| Tetramethylammonium hydroxide | 20 g/L |
| Water | Balance |

The stripping temperatures and times were as shown in Table 4.

TABLE 4

| TEMPERATURE (° C.) | STRIPPING TIME |
| --- | --- |
| 32 | 75 sec. |
| 39 | 62 sec. |
| 43 | 50 sec. |
| 52 | 40 sec. |

All of the polymerized photoresist which was treated with the alkaline stripping solutions was removed in the temperature range of 32° C. to 52° C. as shown by bare copper. The four copper ingots after stripping appeared substantially the same as in FIG. 4.

What is claimed is:

1. A method comprising:
   a) providing a substrate comprising polymerized negative acting photoresist; and
   b) contacting the substrate comprising the polymerized negative acting photoresist with an aqueous alkaline solution consisting of ammonium hydroxide at a concentration of 0.1 g/L to 15 g/l, one or more alkanolamines at a concentration of 0.5 g/l to 100 g/L, one or more quaternary ammonium hydroxides and one or more anticorrosion agents and water to remove the polymerized negative acting photoresist from the substrate.

2. The method of claim 1, wherein the polymerized negative acting photoresist is removed from the substrate at temperatures of 15° C. or higher.

3. The method of claim 2, wherein the polymerized negative acting photoresist is removed from the substrate at temperatures of 30° C. to 50° C.

4. The method of claim 1, wherein the one or more anticorrosion agents are chosen from aromatic hydroxyl compounds and triazole compounds.

5. The method of claim 1, wherein the polymerized negative acting photoresist has a thickness of 10 μm or greater.

6. The method of claim 5, wherein the polymerized negative acting photoresist is an inner layer polymerized photoresist and has a thickness of 30 μm to 40 μm.

7. The method of claim 5, wherein the substrate is a printed circuit board.

8. The method of claim 7, wherein the polymerized negative acting photoresist is an outer layer and has a thickness of 50 μm to 100 μm.

* * * * *

UNITED STATES PATENT AND TRADEMARK OFFICE
CERTIFICATE OF CORRECTION

| | | Page 1 of 1 |
|---|---|---|
| PATENT NO. | : 8,975,008 B2 | |
| APPLICATION NO. | : 13/898802 | |
| DATED | : March 10, 2015 | |
| INVENTOR(S) | : Paul J. Ciccolo et al. | |

It is certified that error appears in the above-identified patent and that said Letters Patent is hereby corrected as shown below:

In the claims,

Col. 8, line 51, Claim 7 should read as follows: 7. The method of claim 1, wherein the substrate is a printed circuit board.

Col. 8, line 53, Claim 8 should read as follows: 8. The method of claim 5, wherein the polymerized negative acting photoresist is an outer layer and has a thickness of 50 μm to 100 μm.

Signed and Sealed this
Nineteenth Day of January, 2016

Michelle K. Lee
*Director of the United States Patent and Trademark Office*